US006189404B1

(12) United States Patent
Hatake et al.

(10) Patent No.: US 6,189,404 B1
(45) Date of Patent: Feb. 20, 2001

(54) ROBOT FOR HANDLING (75) Inventors: Kazuhiro Hatake; Tatsunori Suwa, both of Kanagawa (JP)

(73) Assignee: Komatsu Ltd., Tokyo (JP)

( * ) Notice: Under 35 U.S.C. 154(b), the term of this patent shall be extended for 0 days.

(21) Appl. No.: 09/367,700

(22) PCT Filed: Feb. 19, 1998

(86) PCT No.: PCT/JP98/00695

§ 371 Date: Aug. 19, 1999

§ 102(e) Date: Aug. 19, 1999

(87) PCT Pub. No.: WO98/36876

PCT Pub. Date: Aug. 27, 1998

(30) Foreign Application Priority Data

Feb. 20, 1997 (JP) .................................................. 9-035829

(51) Int. Cl.$^7$ .................................. B25J 18/00; B25J 9/12
(52) U.S. Cl. ..................................... 74/490.03; 414/744.5; 310/103; 901/23
(58) Field of Search ............................. 74/490.1, 490.03; 414/744.5; 310/103; 901/23

(56) References Cited

U.S. PATENT DOCUMENTS

| 5,539,266 | * | 7/1996 | Stevens ............................... 901/23 X |
| 5,583,408 | * | 12/1996 | Lowrance ........................... 318/568.1 |
| 5,720,590 | * | 2/1998 | Hofmeister ......................... 414/744.2 |
| 6,102,164 | * | 8/2000 | McClintock et al. ......... 414/744.5 X |

FOREIGN PATENT DOCUMENTS

| 3-136779 | 6/1991 | (JP) . |
| 7-55464 | 6/1995 | (JP) . |
| 8-506771 | 7/1996 | (JP) . |

* cited by examiner

Primary Examiner—Allan D. Herrmann
(74) Attorney, Agent, or Firm—Armstrong, Westerman, Hattori, McLeland & Naughton

(57) ABSTRACT

A handling robot prevents a positioning in a motor unit power transmission system from becoming inaccurate and can eliminate occurrence of vibrations due to a twisting deformation and so forth in the system. The handling robot has an arm fastened to an outside of each of a plurality of ring bosses that are arranged coaxially and turnably. Each of such arms is connected via a link to a carrier table so that turning the ring bosses in mutally opposite directions may cause the carrier table to reciprocate in a perpendicular direction to a turning axis; and turning them in a same direction may cause the carrier table to turn. A plurality of motor units corresponding to the ring bosses are arranged coaxially with each other and at positions that are insides of the ring bosses and lower than a position where the carrier table may operate. A connecting member is further arranged and is shaped in the form of a cup in cross section and fastened to the output member of each of the motor units, such connecting members being connected to the ring bosses, respectively.

8 Claims, 13 Drawing Sheets

ROBOT FOR HANDLING

TECHNICAL FIELD

The present invention relates to a handling robot for use in a multiple chamber type manufacturing system such as for manufacturing semiconductors and LCDs in which a plurality of process chambers designed to constitute individual stations or stages are arranged around a transfer chamber, and a workpiece in the form of a sheet or thin plate such as a wafer to be worked on and processed in each of the process chambers is transferred by the handling robot from one of the process chambers to another via the transfer chamber.

BACKGROUND ART

Figure 1:
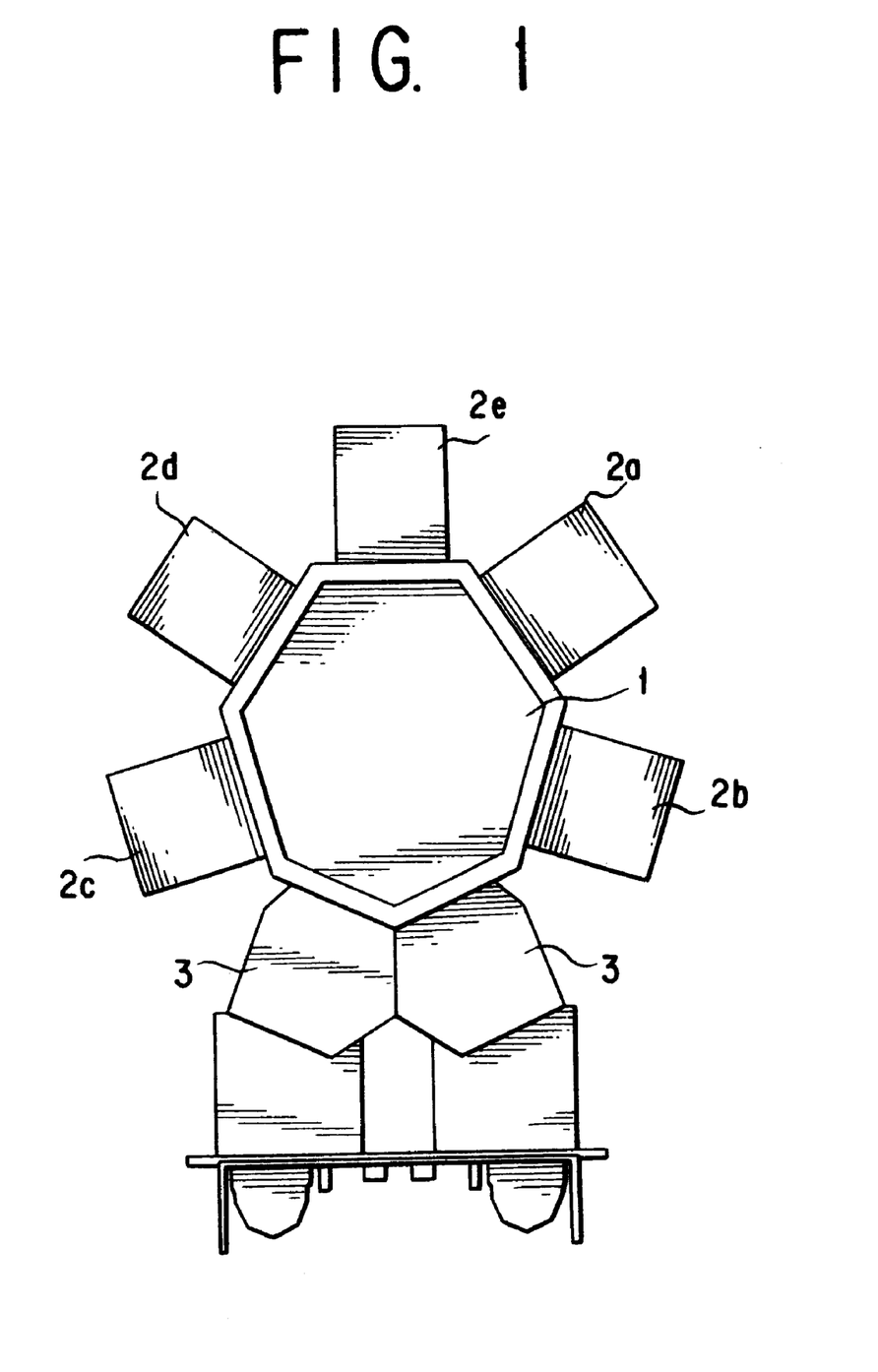
FIG. 1 is a diagrammatic plan view of a semiconductor manufacturing system that is an example of the multiple chamber type manufacturing system.

A multiple chamber type semiconductor manufacturing system constructed as shown in FIG. 1 includes a transfer chamber 1 around which a plurality of process chambers stations 2a, 2b. 2c, 2d, 2e, each comprising a process chamber, and a workpiece delivery station 3 for delivering workpieces to and from the outside are arranged. The inside of the transfer chamber 1 is normally held in vacuum by suitable vacuum equipment.

Figure 2:
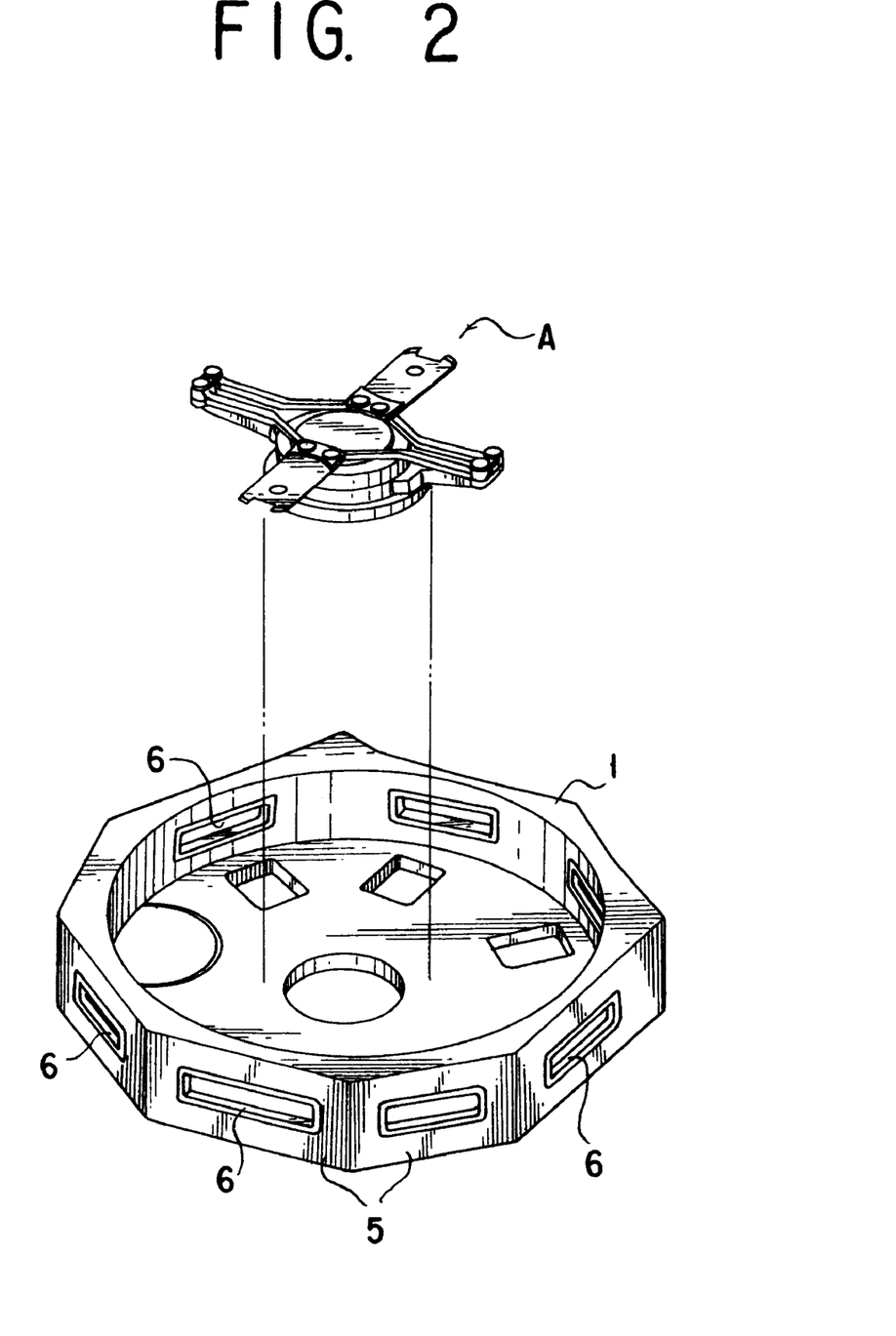
FIG. 2 is an exploded perspective view illustrating relationship between a transfer chamber and a handling robot.

The transfer chamber 1 is constructed as shown in FIG. 2, having a handling robot A disposed rotatably in its central region. Constituting its peripheral wall, partition walls 5 that are opposed to the process chamber stations 2a, 2b, 2c, 2d, 2e and the workpiece delivery station 3 are formed with gates 6, respectively, each of which provides an inlet and outlet for a workpiece into and out of each process chamber station. These gates 6 so as they may be opened and closed are provided with their respective opening/closing doors (not shown) arranged in opposition thereto, respectively, inside the transfer chamber 2.

For the handling robot A is used typically a robot of double arm type, so called "frog leg" type, which is constructed as shown in FIG. 3 through FIGS. 6A and 6B.

Figure 3:
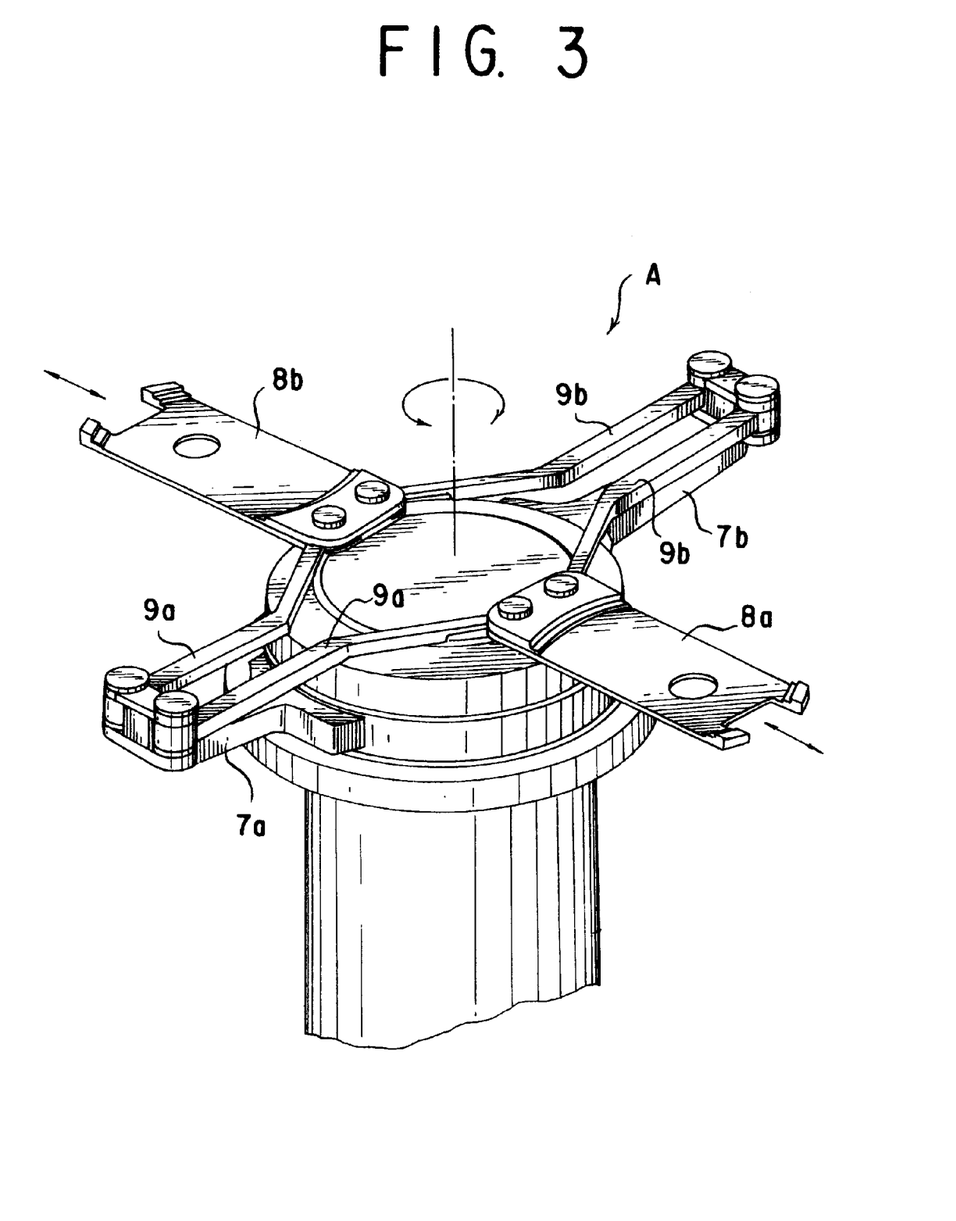
FIG. 3 is a perspective view showing an example of the handling robot.

As shown, the handling robot A has a pair of arms 7a and 7b of an identical length each of which is turnable about a center of rotation. It also has a pair of carrier tables 8a and 8b of an identical form, having their respective bases to each of which respective one ends of a pair of links 9a and 9b having an identical length are connected. The respective one ends of the two links 9a and 9b are connected to each of the two carrier tables 8a and 8b through a frog leg type carrier table posture (attitude) control mechanism so that the two links may turn completely symmetrically with respect to each of the carrier tables 8a and 8b. And, one of the two links connected to each of the carrier tables 8a and 8b is connected to one of the arms while the other link is connected to the other arm.

Figure 4A:
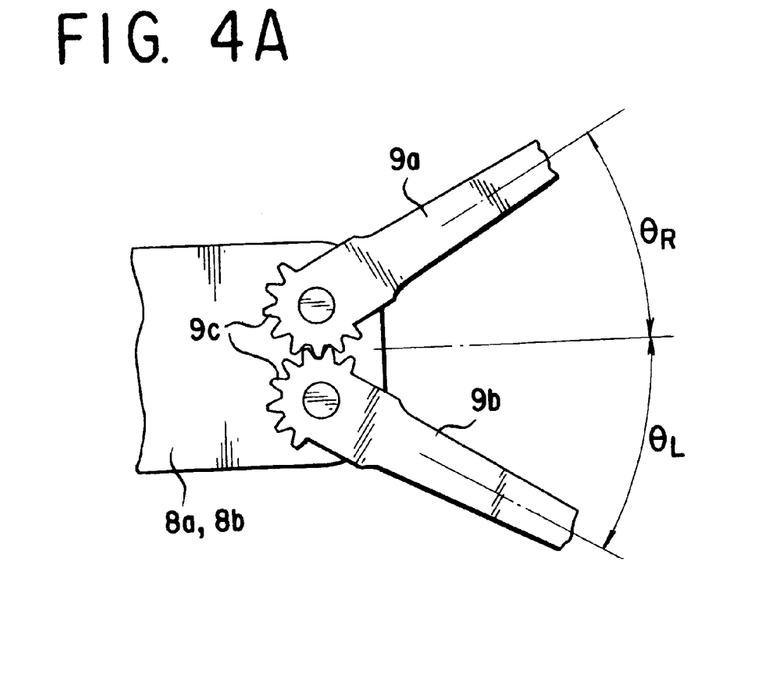
FIGS. 4A and 4B are explanatory views showing a carrier table posture control mechanism.
Figure 4B:
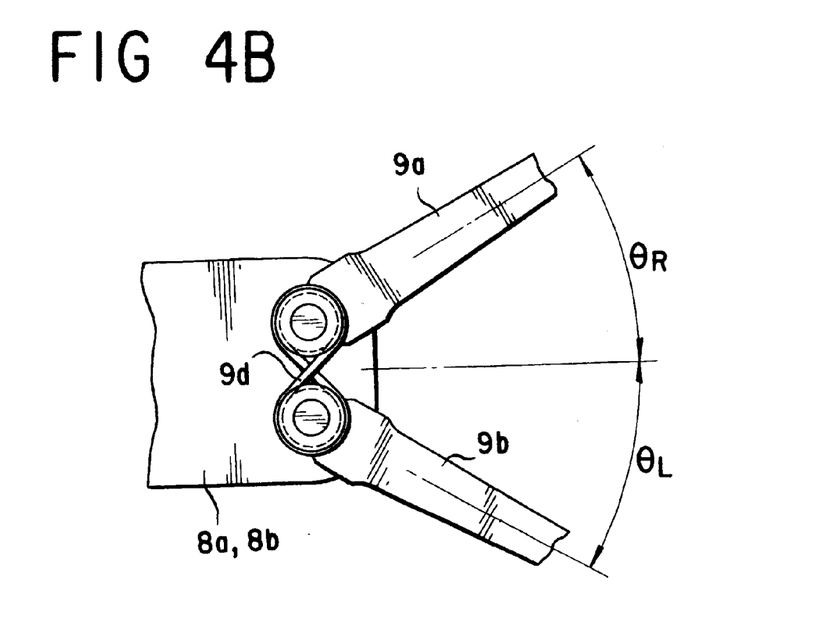

FIGS. 4A and 4B show different forms of the frog leg type carrier table posture control mechanism mentioned above. Thus, as shown in FIG. 4A, the respective one ends of the two links 9a and 9b may be connected to each of the carrier tables 8a and 8b through a gear structure comprising a pair of gears 9c and 9c in mesh with each other so that the respective posture angles θR and θL of the links 9a and 9b with respect to each of the carrier tables 8a and 8b may always be held identical to each other. This permits each of the carrier tables 8a and 8b to be oriented and to be moved in a radial direction of the transfer chamber 1. For the links 9a and 9b to be connected to the carrier tables 8a and 8b, in lieu of the gears a crossed belting arrangement 9d may be employed as shown in FIG. 4B.

Figure 5:
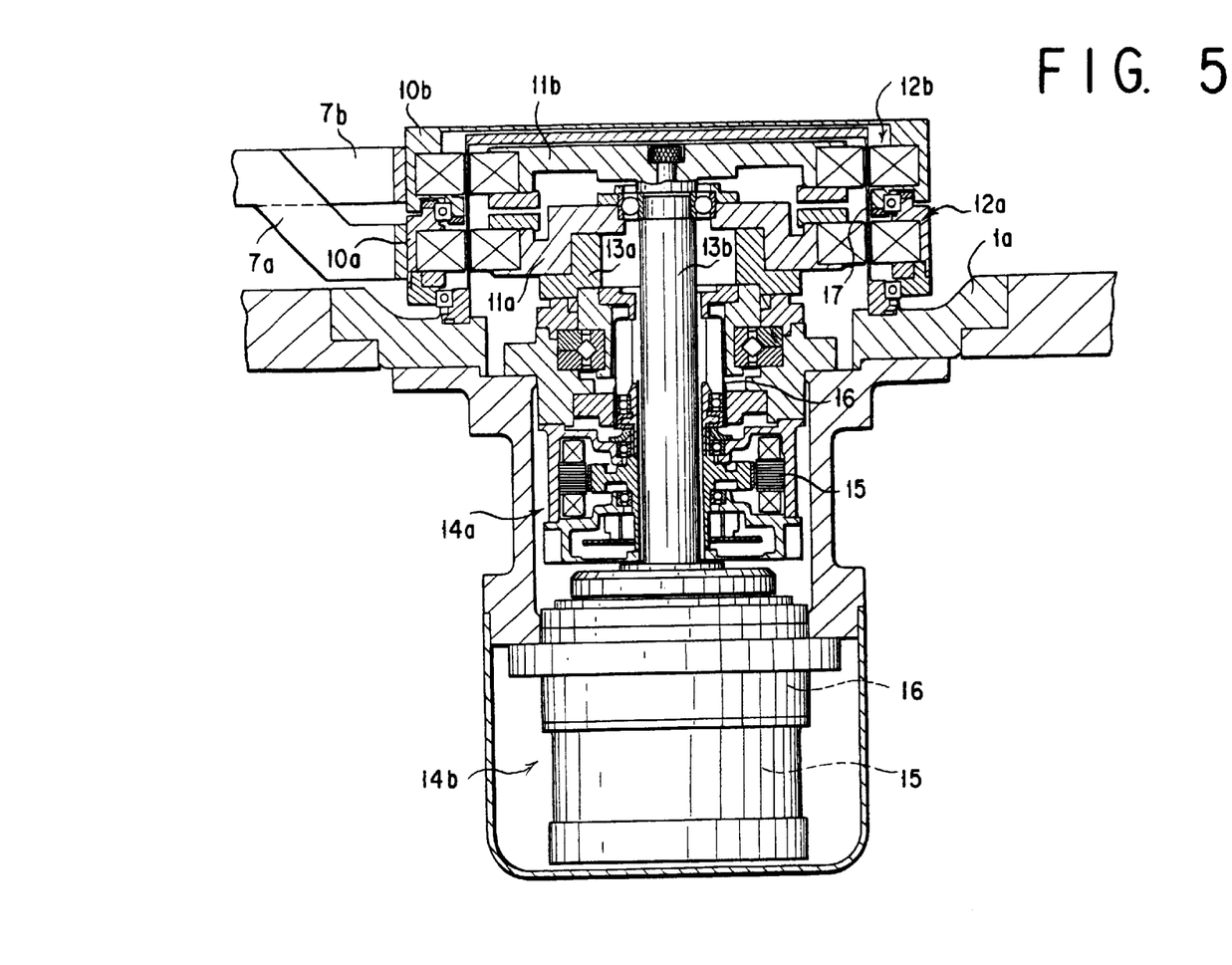
FIG. 5 is a cross sectional view showing an arm turning mechanism for the conventional handling robot.

FIG. 5 shows a conventional mechanism for turning the arms 7a and 7b independently of each other. The bases of the arms 7a and 7b are each in the form of a ring and are constituted with ring bosses 10a and 10b, respectively, which are positioned coaxially about the center of rotation and supported turnably with respect to the transfer chamber 1.

Inside of each of the ring bosses 10a and 10b is arranged arranged a disk boss 11a, 11b coaxially therewith and opposed thereto, respectively. Each pair of the ring boss and the disk boss 10a and 11a, 10b and 11b that are opposed to each other are magnetically coupled together with each of a magnetic coupling 12a, 12b in the rotary direction.

The rotary shafts 13a and 13b of the disk bosses 11a and 11b are arranged coaxially with each other and are connected to the output sections of the motor units 14a and 14b, respectively, which are in turn supported coaxially with each other and axially deviated in position from one to the other on a frame 1a of the transfer chamber 1. Here, the rotary shaft 13b of one motor unit 14b is elongated and arranged to pass through the other motor unit 14a and then to continue to extend upwards.

The motor units 14a and 14b may each be an integral combination of an AC servo motor 15 and a reducer 16 using a harmonic drive (a trade name, the representation which will not be repeated hereafter) in which the output sections of the reducers 16 and 16 are connected to the base ends of the rotary shafts 13a and 13b, respectively. Because once the arms 7a and 7b are positioned the transfer chamber 1 is to be maintained in a vacuum state, partition wall 17 is provided between the ring bosses 10a, 11b and the disk bosses 11a,11b.

Figure 6A:
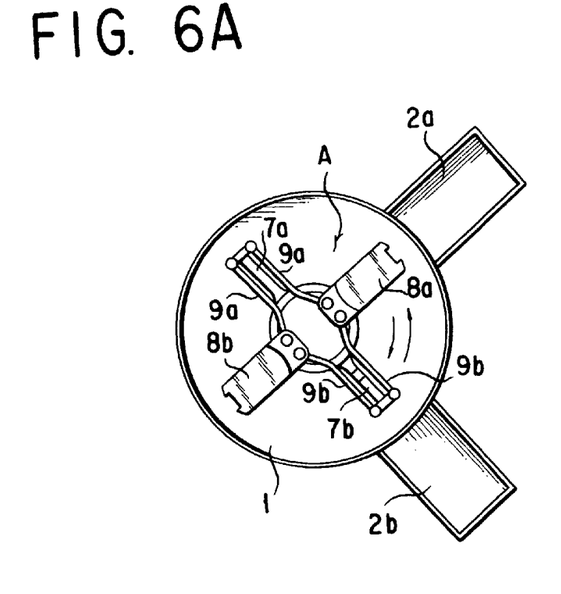
FIGS. 6A and 6B are operation explanatory views of the handling robot.

FIGS. 6A and 6B are used to describe an operation of the handling robot A. When the two arms 7a and 7b lie at diametrically opposed, symmetrical positions about the center of rotation as shown in FIG. 6A, the two links 9a and 9b will each have had turned to have its two legs opened at maximum with respect to the carrier tables 8a and 8b. The two carrier tables 8a and 8b will then have been moved towards the center of rotation or turning.

Figure 6B:
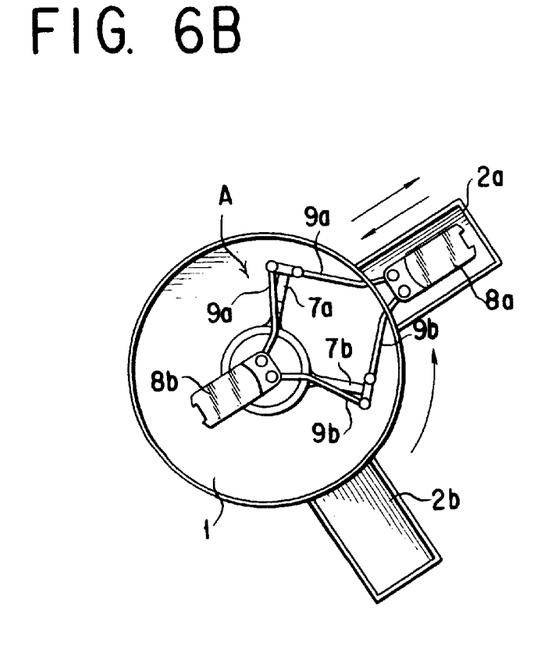

In this state, turning the two arms 7a and 7b in a given direction will cause the two carrier tables 8a and 8b to turn about the center of rotation while maintaining their radial positions. Conversely, turning the two arms 7a and 7b from the state shown in FIG. 6A in opposite directions such as to have them approach each other will cause the one carrier table 8a of the position where the angle the arm 7a makes with the arm 7b is decreasing to be pushed by the links 9a and 9b to move to project radially outwards and thus to be plunged or forced into the process chamber of the one of stations 2a, 2b, 2c, 2d and 2e that is adjacent thereto radially outside of the transfer chamber 1 as shown in FIG. 6B.

In this case, while the other carrier table is moved towards the center of rotation or turning, the distance of this movement will be small because of the angles the arms 7a and 7b are making with the links 9a and 9b.

In the conventional handling robot described, a plurality of coaxial drive shafts must be provided and a motor unit is combined with a load by using, for example, a hollow shaft, as shown in FIG. 5. For these reasons, an elongated path of power transmission is entailed. There may thus result a positioning inaccuracy and a twisting that tend to produce vibrations. In order to avoid these inconveniences, it is desirable to shorten the path of power transmission as much as possible.

As a related prior art, there also exists a handling robot that makes use of a direct drive type motor operated in a vacuum as shown in Japanese Patent Literature No. Hei 8-506771 A in which a pair of motors are arranged coaxially and vertically up and down with their output shafts oriented in a same direction. The upper motor is hollow into which the output shaft of the lower motor is inserted. Thus, the output shaft of the lower motor is again necessarily elongated and also to that extent there may arise a problem of twisting vibrations. A further problem involved in this type of the prior art is the need to use a special material that less emits gases for windings that constitute the motors, and such components and parts as sensors and bearings.

In an attempt to meet with these problems there has also be proposed as shown in Japanese Patent Literature No. Hei 7-55464 B a handling robot in which a pair of motors are arranged coaxially and vertically up and down with their output shafts opposed to each other. These opposed output shafts of the motors have a flange type driving member fastened thereto which is connected to a driven member with a magnetic coupling. In this prior art, the two motors are allowed to project both upwards and downwards and as a result the drive section including these motors is constructed to allow the axial center part to come to interfere with the handling operation part.

This requires the handling operation by the carrier tables to be performed radially outside of the drive section including the two motors, and thus the handling operation part to be larger in its radius of rotation, and hence involves the problem that the transfer chamber in which the handling operation part is accommodated must be larger in size.

The present invention has been created with the above mentioned problems taken into account and has for an object thereof to provide a handling robot that makes the output section of a motor unit extremely rigid, prevents positioning in a handling operation from becoming inaccurate and eliminates occurrence of vibrations due to a twisting deformation, and yet permits the presence of a drive section including a motor unit to hinder in no way an operation of the handling working section.

DISCLOSURE OF THE INVENTION

Provided to achieve the object mentioned above, a handling robot according to the present invention has, to start with, a construction in which an arm is fastened to an outside of each of a plurality of ring bosses that are arranged coaxially and turnably, deviated in position in a vertical direction, each of such arms is connected via a link to a carrier table so that turning the ring bosses in mutually opposite directions may cause the carrier table to reciprocate in a perpendicular direction to a turning axis and turning them in a same direction may cause the carrier table to turn. The handling robot in accordance with the present invention may comprise: a plurality of motor units corresponding to the ring bosses and arranged coaxially with each other and at positions that are lower than a position where the carrier table may operate and that are deviated in a vertical direction; a connecting member shaped in the form of a cup in cross section and fastened to an output member of each of the motor units, such connecting members being connected to the ring bosses, respectively.

According to the construction mentioned in the preceding paragraph, it can be seen and should be appreciated that rotation of each of the motor units will cause the carrier table to move radially towards and away from a center region of each corresponding ring boss. It will also be turned about the center of the ring boss. A rotary output furnished from the output member of each motor unit will be transmitted to each ring boss via the connecting member that is shaped in the form of a cup.

The connecting member being shaped in the form of a cup in cross section will make the output section of each motor unit extremely rigid. Each connecting member being connected to the output member of each motor unit will prevent a positioning in the motor unit power transmission system from becoming inaccurate and eliminate occurrence of vibrations owing to a twisting deformation and so forth. Also, by positioning each motor unit driving each corresponding ring boss to turn at a level that is lower than a level at which the carrier table may operate, the drive section that includes the motor units will no longer and in no way hinder the operation of the handling working section.

Next, a handling robot comprises a plurality of motor units of direct drive type which are arranged coaxially with each other and disposed at vertically deviated positions, the said motor units having their respective motor rotors, at least one of the said motor rotors being substantially coincident in position with a corresponding arm of the robot, each of the motor units having an output member to which an arm of the robot is fastened, each of such arms being connected via a link to a carrier table, the said carrier table being adapted both to reciprocate in a perpendicular direction to an axis of said motor units, and to turn.

In accordance with the construction mentioned in the preceding paragraph, a handling robot that is thin in form can be provided having a robot driving section with a reduced amount of protrusion towards the lower part of the transfer chamber that permits a greater space of maintenance to be established below a manufacturing equipment. Further, where the manufacturing equipment as a whole needs to be thermally insulated such as in a high temperature process, the ability to flatten an exterior of the manufacturing equipment at its robot attachment side allows thermal insulation members to be easily assembled, yet providing an enhanced effect of thermal insulation.

Furthermore, thereby a power transmission member is made unnecessary, the stiffness of the robot body in a rotary direction is increased, vibrations are reduced that develop in the robot body while it is operated and when it comes to stop, thus enhancing a positioning accuracy thereof as well.

BEST MODE FOR CARRYING OUT THE INVENTION

Various forms of embodiment of the present invention will be described with reference to FIG. 7 and the subsequent drawings figures. It should be noted that in explanation of these form of embodiments the same reference numerals and characters as used in Figures up to FIG. 6B are used to designate same conventional components and members, and a repeated explanation thereof is here omitted.

Figure 7:
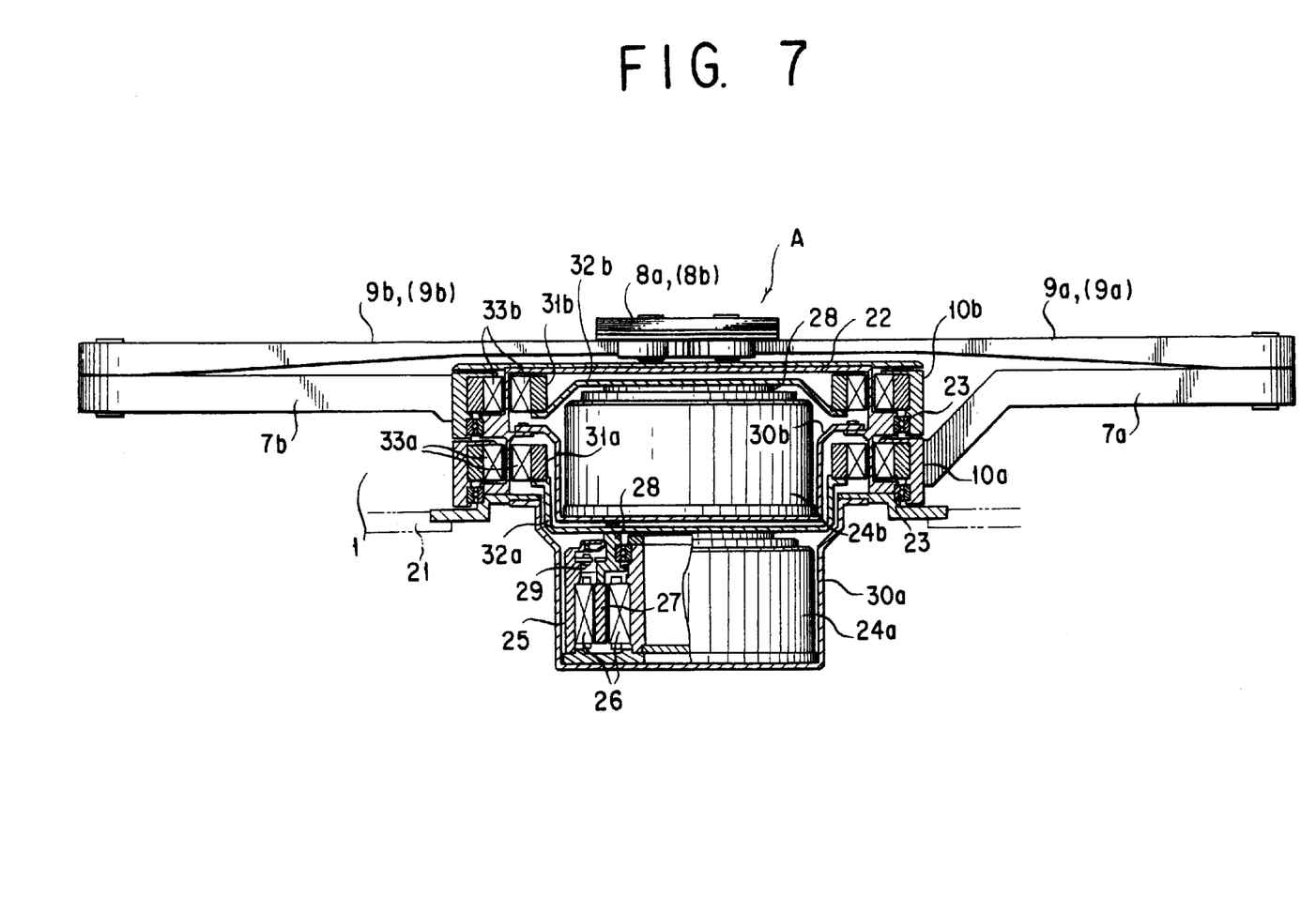
FIG. 7 is a cross sectional view showing an example of the arm turning mechanism according to the present invention.

FIG. 7 shows a first form of embodiment of the present invention in which the ring bosses 10a and 10b have the bases of the pair of arms 7a and 7b fastened thereto, respectively. Each ring boss 10a, 10b is rotatably supported via a bearing 23, 23 by a partition member 22 which is in the form of cylinder with its top closed and fastened to a frame 21 of the transfer chamber 1 at its lower end portion.

The partition member 22 has an upper end that is shaped in the form roughly of a cap with its upper end (side) closed, The partition member 22 has a lower end portion that is fastened to the frame 21 of the transfer chamber 1. The partition member 22 serves to hermetically block a communication between the inside of the transfer chamber 1 and the inside of the boss section. And, inside of the partition member 22 are arranged a pair of motor units 24a and 24b coaxially with each other and in line in their axial direction, by which the ring bosses 10a and 10b are to be driven, respectively.

Each of the motor units 24a and 24b makes use of a direct drive type electric motor that may take the form of a relatively flat cylinder, and comprises a case 25, a motor stator 26, 26, a motor rotor 27, and a cylindrical output member 28 that is coupled to the motor rotor 27. A position detector 29 is also included for detecting an angle of rotation of the output member 28.

In the form of embodiment shown in FIG. 7, the output members 28 and 28 are arranged to lie on the upper sides of the two motor units 24a and 24b, respectively. The lower motor 24a is supported by the base of the partition member 22 and the upper motor 24b is supported by a vertically mid portion of the partition member 22, via support members 30a and 30b, respectively.

And, of the two ring bosses 10a and 10b, the lower lying ring boss 10a has in its inside a lower inside boss 31a opposite thereto across the partition member 22 and the upper lying ring boss 10b has in its inside an upper inside boss 31b opposite thereto across the partition member 22. The lower inside boss 31 and the upper inside boss 31b are connected to the output members 28 of the lower motor unit 24a and to the output member 28 of the upper motor unit 24b via connecting members 32a and 32b, respectively. Each of the connecting members 32a and 32b is made of a sheet or thin plate shaped into the form of a cup in cross section. The depth of the cup portion of each connecting member 32a, 32b is determined depending on the axial position of each inside boss 31a, 31b. The ring boss 10a and the inside boss 31a, and the ring boss 10b and the inside boss 31b, are magnetically coupled to each other with magnetic couplings 33a and 33b, respectively, which are opposite to each other across the partition member 22.

The two ring bosses 10a and 10b have the arms 7a and 7b fastened thereto, respectively, which support the conventional handling working section of the handling robot A shown in FIGS. 3 through 6B. Here, that handling working section lies above the top surface of the partition member 22 so that a top area of the partition member 22 may not hinder the operation of the robot handling working section.

In the construction described, the two motor units 24a and 24b are rotated to perform a same robot handling operation previously described in connection with FIGS. 3 through 6B. Driving the two motor units 24a and 24b in a same direction will cause the two carrier tables 8a and 8b to turn about the center of rotation or on their turning center while maintaining their radial positions, as shown in FIG. 6A. Conversely, driving the motor units 24a and 24b to rotate in mutually opposite directions will cause the one of carrier tables, i.e. 8a, that is so position that the angle it makes with the arm 7a, 7b is then decreasing to be pushed to project or move radially outwards and then to move into the process chamber in one of the stations 2a, . . . , 2e and 3 which are disposed adjacent to and radially outwards of the transfer chamber 1.

In the construction described, connecting the driving side that is constituted by the output member 28, 28 of each of the motor units 24a and 24b to the driven side via the connecting member 32a, 32b that is in the form of a cup in cross section will make the structure that forms the path of power transmission very rigid and least elastically deformable, thus to prevent occurrence of vibrations in spite of the fact that the connecting member 32a, 32b may be constructed to be conveniently thin and of a sheet.

Figure 8:
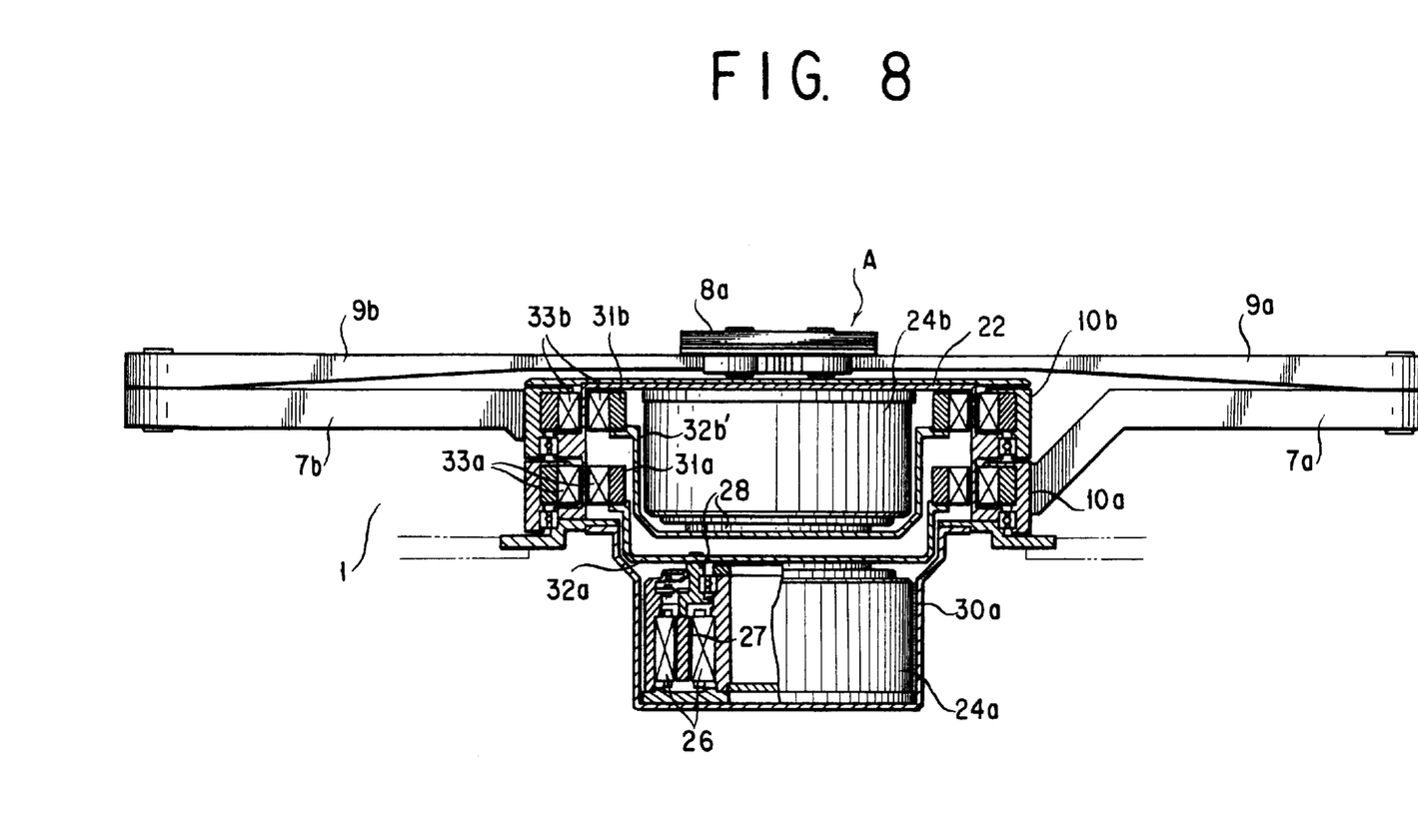
FIG. 8 is a cross sectional view showing another example of the arm turning mechanism according to the present invention.

FIG. 8 shows a second form of embodiment of the present invention in which the vertical orientation of the upper motor unit 24b is reversed and the output member 28 is positioned at its lower side. In this form of embodiment, the upper motor unit 24b is fastened to a top inner surface of the partition member 22 and thus is suspended. And, with the output member 28 being positioned lower here than in the case of FIG. 7, a connecting member 32b' is employed that is in the form of a deeper cup for connecting the output member 28 and the inside boss 31b together.

Figure 9:
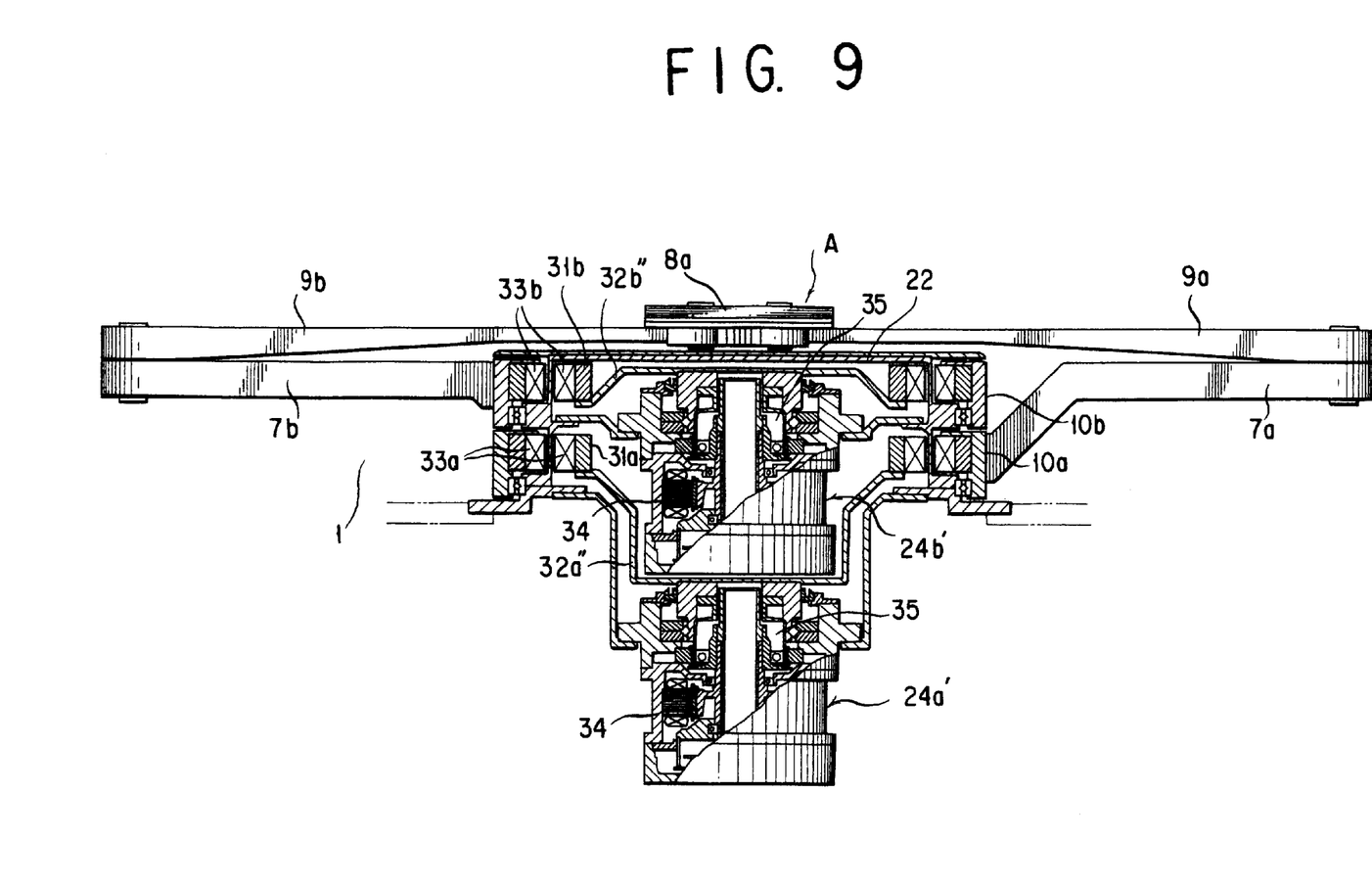
FIG. 9 is a cross sectional view showing another example of the arm turning mechanism according to the present invention.

FIG. 9 shows a third form of embodiment of the present invention. In this embodiment and those that follow, each motor unit is constructed to combine a motor 34 and a reducer 35 which may each be of a conventional design, and is denoted by reference character 24a', 24b'. The output member of the reducer 35, 35 of each of the motor units 24a' and 24b' has a connecting member 32a", 32b" connected thereto which is here again made of a sheet material and shaped into a cup form, and which is connected to the corresponding inside bosses 31a, 31b. Each of the reducers 35, 35 here consists of a harmonic drive having a large reduction ratio.

Figure 10:
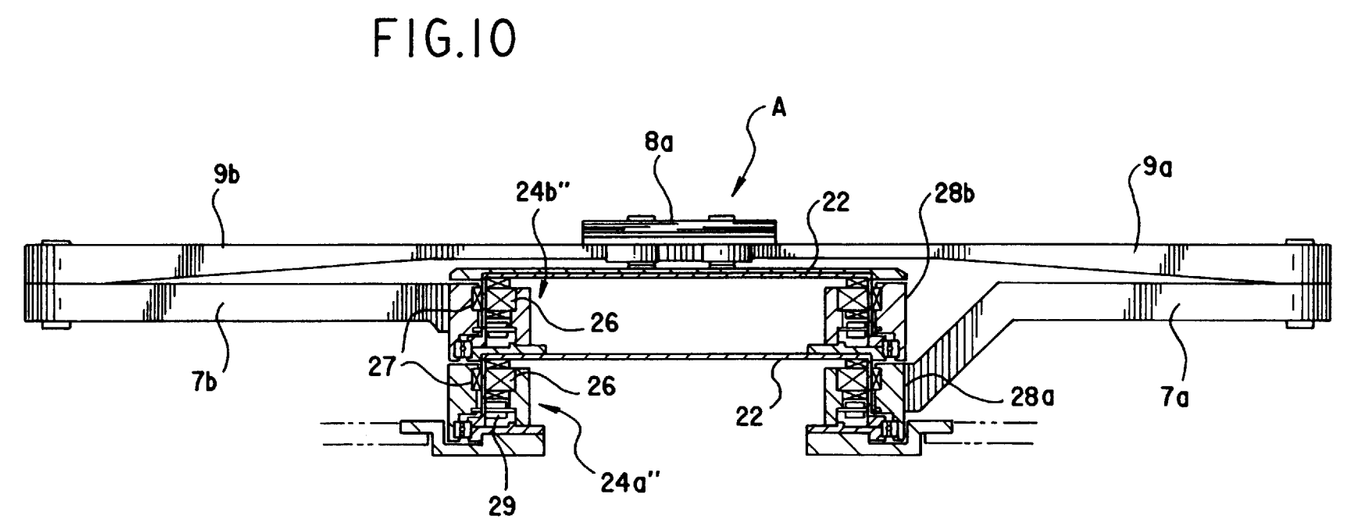
FIG. 10 is a cross sectional view showing another example of the arm turning mechanism according to the present invention.

Referring to FIG. 10 in which a fourth form of embodiment of the present invention is illustrated as omitting a magnetic coupling, a pair of motor units 24a" and 24b" are shown as employed that are of direct drive type which are arranged coaxially with each other and made integral as disposed at vertically deviated positions. These motor units have their respective output members 28a and 28b having the robot arms directly fastened respectively thereto. The motor units 24a' and 24b' have motor stators 26 and 26 positioned oppositely to their motor rotors 27 and 27 across the partition member 22, respectively, which are in turn fastened to the motor output members 28a and 28b, respectively. It should be noted that the motor unit output members 28a and 28b referred to in this form of embodiment are designed to function identically in the arm attachment to the ring shaped bosses 10a and 10b described hereinbefore in the previous forms of embodiment.

In this form of embodiment, the carrier table unit that is connected to the two ring bosses 10a, 10b may be of the same construction as used for the handling robot A shown in FIGS. 3 through 6B. Alternatively, however, it may be a carrier table unit as shown in FIG. 11 and the subsequent drawing figures, in which carrier tables 8a and 8b are moved to operate in a same direction.

Figure 11:
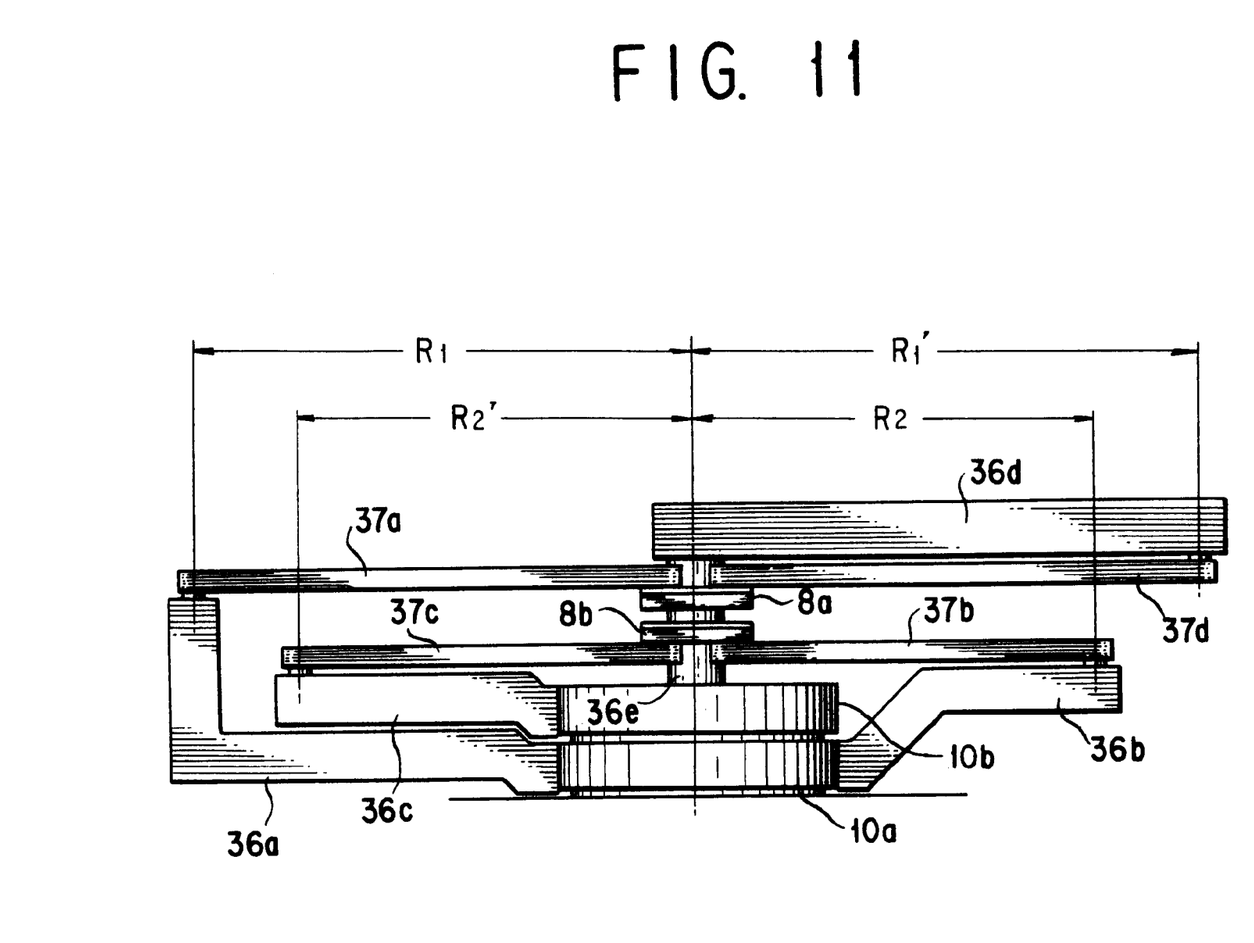
FIG. 11 is a front view showing another example of the carrier table apparatus.

Thus, as shown FIG. 11 and the subsequent drawing figures; the lower ring boss 10a has on side surfaces thereof a first and a second arm 36a and 36b projecting diametrically outwards thereof and in its diametrically opposite directions. Also, the upper ring boss 10b has on a side surface thereof a third arm 36c projecting radially outwards thereof. A leg column 36e is mounted on a top surface of the upper ring boss 10b and has on its top a fourth arm 36d extending radially outwards thereof in the opposite direction.

These arms 36a to 36d have their circumferential arrangements and distances from the rotational center of the ring bosses to the points of support or fulcrums at the end thereof on which links turn respectively, as shown and mentioned below. Specifically, the first and second arms 36a and 36b that project from the lower ring boss 10a have such distances R1 and R2 as are different, i.e. R1<R2. The third and fourth arms 36c and 36d that project from the upper ring boss 10b directly or via the leg column 36e have such distances R2' and R1' as are different, i.e. R1'<R2'. In this particular embodiment, R1=R1', R2=R2'. The first arm 36a that is longer has its point of support or turning support point provided to lie on an upper surface of its end, the fourth arm 36d has a turning support point provided to lie on a lower surface of its end, these turning centers have the same position in a vertical direction. The second and third arms 36b and 36c that are shorter have their turning support points on upper surfaces of their ends which have the same position in a vertical direction.

The first and fourth arms 36a and 36d that are longer have on their respective turning support points a first and a fourth link 37a and 37d of an identical length connected thereto turnably at their respective one ends. The respective other ends of these two links 37a and 37d have a first carrier table 8a connected thereto via a frog leg type carrier table posture control mechanism. Here, these two links 37a and 37d have a length such that their points of connection with the carrier table 8a may, when the two arms 36a and 36d are aligned with each other diametrically in relation to the center of rotation or turning of the boss section, be deviated or moved from a line connecting their turning support points in a direction in which the carrier table 8a is projected or moved out.

The second and third arms 36b and 31c that are shorter have on their respective turning support points a second and a third link 37b and 37c of an identical length connected thereto turnably at their respective one ends. The respective other ends of these two links 37b and 37c have a second carrier table 8b connected thereto via a frog leg type carrier table posture control mechanism. Here, these two links 37b and 37c have a length such that their points of connection with the carrier table 8b may, when the two arms 36b and 36c are aligned with each other diametrically in relation to the center of rotation or turning of the boss section, be deviated or moved from a line connecting their turning support points in a direction in which the carrier table 8b is projected or moved out, and take an identical position below the first carrier table 8a.

Figure 12:
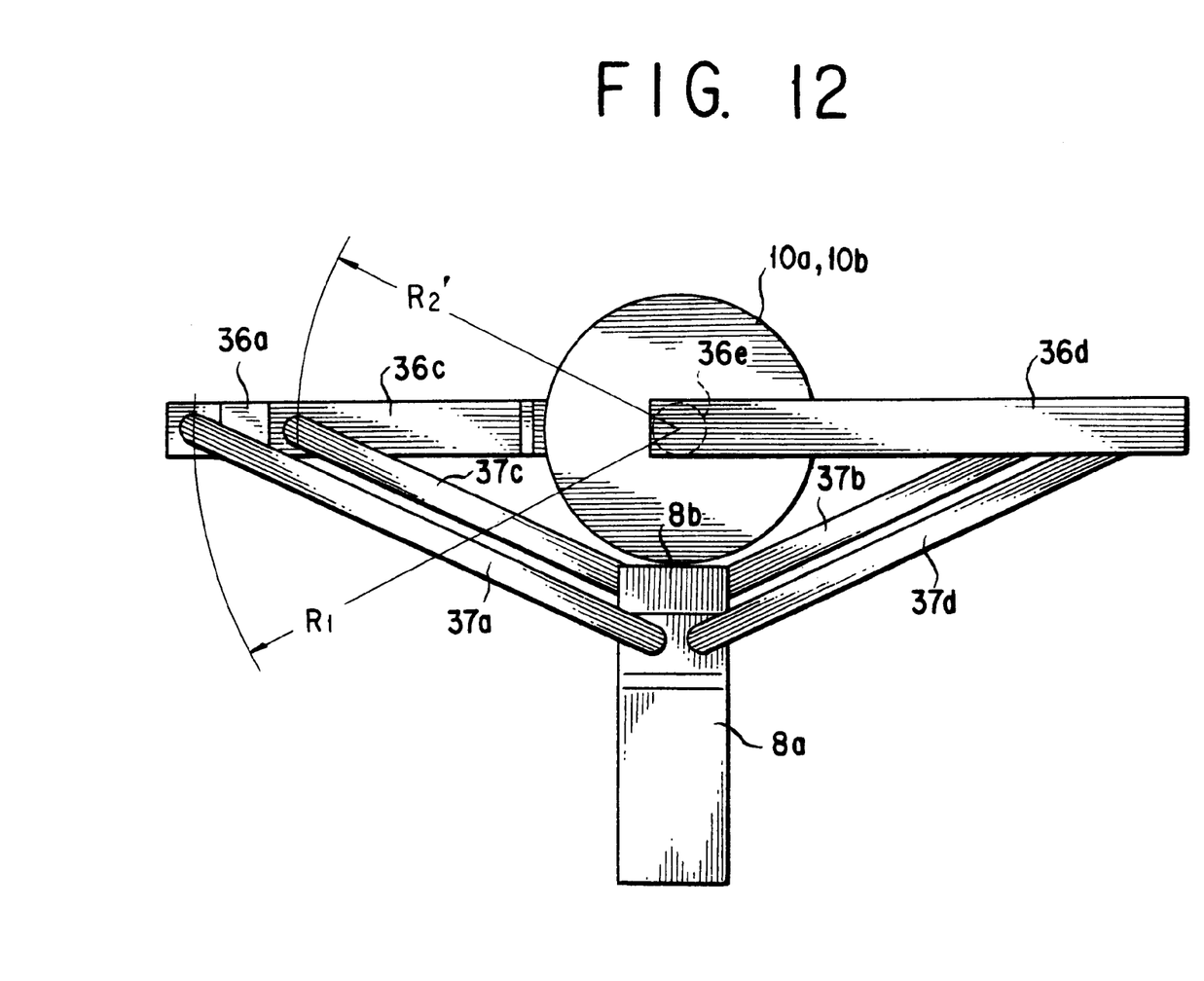
FIG. 12 is a plan view showing another example of the carrier table apparatus.

In the construction described, the state as shown in FIG. 12 in which the first and fourth arms 36a and 36d are aligned with each other diametrically of the boss section and the second and third arms 36band 36c when positioned identically with the first and fourth arms in the turning direction are aligned with each other diametrically of the boss section is assumed to be at a standby position.

Figure 13:
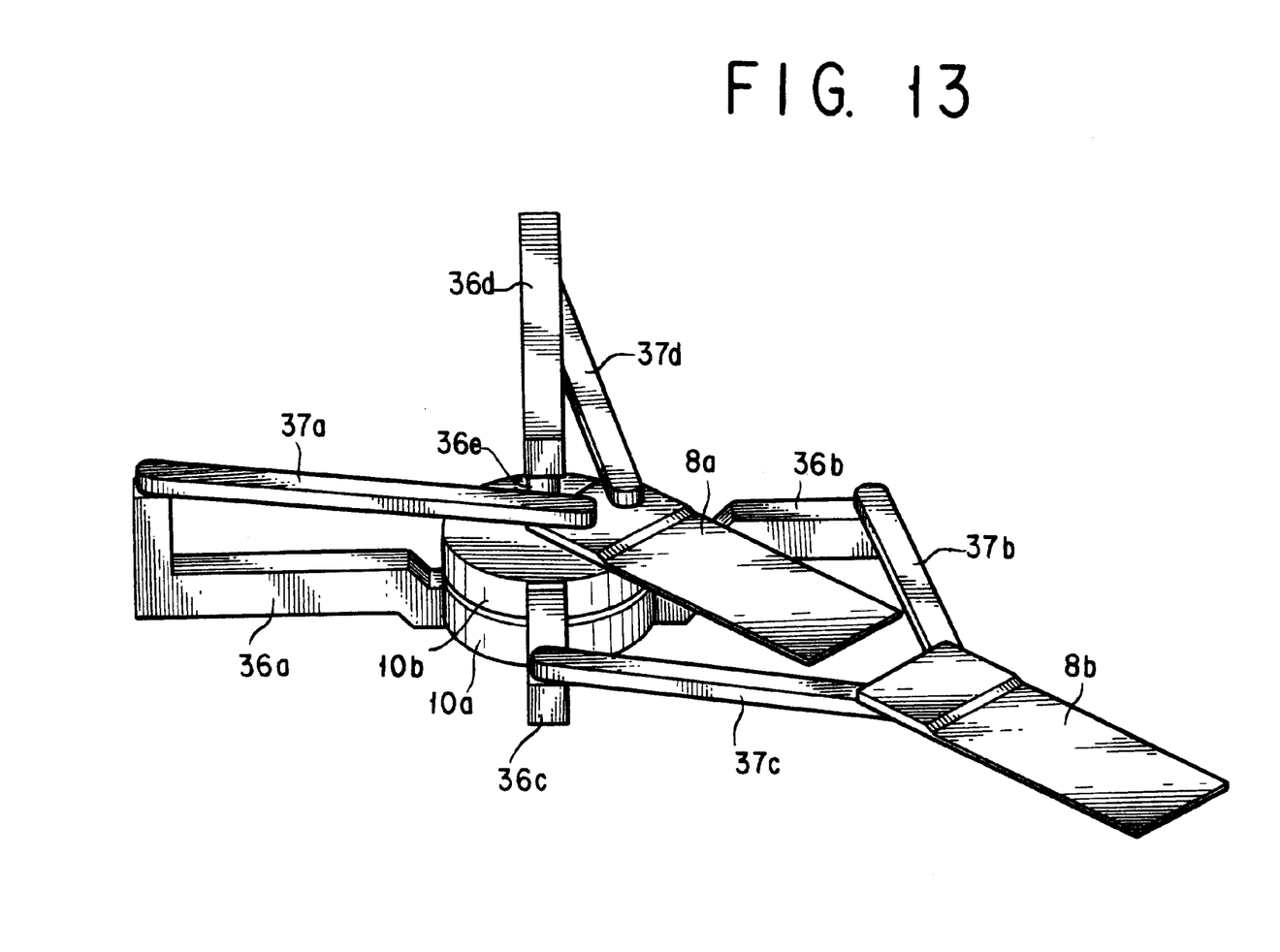
FIG. 13 is a perspective view showing another example of the carrier table apparatus.

In this state, turning individually the two ring bosses 10a and 10b to cause the second and third arms 36b and 36c to turn so they both may approach the second carrier table 8b will permit the second carrier table 8b to project or to be moved out as shown in FIG. 13. Then, the first and fourth arms 36a and 36d will turn each away from the first carrier 8a side, thereby permitting the first carrier table 8a to be retracted and moved slightly in the direction opposite to the direction in which the second carrier table 8b is moved. The retraction should be to an extent that does not cause a contact of the first carrier table with the leg column 36e.

Conversely, turning the first and fourth arms 36a and 36d each towards the first carrier table 8a will cause the first carrier table 8a to project and to be moved out as reversely shown in FIG. 13. Then, the second and third arms 36b and 36c will turn each away from the second carrier table 8b, thereby permitting the second carrier table 8b to be slightly retracted and moved in the direction opposite to the direction in which the first carrier table 8a is moved. The retraction should be so slight that a contact of the second carrier table with the leg column 36e may not occur.

Also, rotating the ring bosses 10a and 10b in a same direction in the standby state will cause the two carrier tables 8a and 8b to turn in the transfer chamber 1.

What is claimed is:

1. A handling robot in which an arm is fastened to an outside of each of a plurality of ring bosses that are arranged coaxially and turnably, deviated in position in a vertical direction, each of such arms is connected via a link to a carrier table so that turning the ring bosses in mutually opposite directions may cause the carrier table to reciprocate in a perpendicular direction to a turning axis and turning them in a same direction may cause the carrier table to turn, characterized in that it comprises:

a plurality of motor units corresponding to the ring bosses and arranged coaxially with each other and at positions that are lower than a position where the carrier table may operate and that are deviated in a vertical direction;

a connecting member shaped in the form of a cup in cross section and fastened to an output member of each of the motor units, such connecting members being connected to the ring bosses, respectively.

2. A handling robot as set forth in claim 1, characterized in that the output members of the motor units are arranged to orient in a common axial direction.

3. A handling robot as set forth in claim 1, characterized in that the output members of the motor units are arranged to orient in opposite different axial directions.

4. A handling robot as set forth in claim 1, characterized in that each of the motor units comprises a motor and a reducer.

5. A handling robot, characterized in that it comprises a plurality of motor units of direct drive type which are arranged coaxially with each other and disposed at vertically deviated positions, said motor units having their respective motor rotors, at least one of said motor rotors being substantially coincident in position with a corresponding arm of the robot in a vertical direction, each of said motor units having an output member to which the arms of the robot are fastened at at least two sites thereon, each of such arms being connected via a link to a carrier table, said carrier table being adapted both to reciprocate in a perpendicular direction to an axis of said motor units, and to turn.

6. A handling robot, characterized in that it comprises a plurality of motor units of direct drive type which are arranged coaxially with each other and disposed at vertically deviated positions, said motor units having their respective motor rotors, at least one of said motor rotors being substantially coincident in position with a corresponding arm of the robot, each of said motor units having an output member to which an arm of the robot is fastened, each of such arms being connected via a link to a carrier table, said carrier table being adapted both to reciprocate in a perpendicular direction to an axis of said motor units, and to turn.

7. A handling robot as set forth in claim 6, characterized in that said carrier table is adapted to reciprocate in the perpendicular direction to axis of the motor unit and to turn, by driving each of said motor units to rotate so as to rotate its output member in opposite rotary directions and in a same rotary direction, respectively.

8. A handling robot as set forth in claim 6, characterized in that said motor units have their respective motor stators, each of said motor stators being positioned oppositely to a respective one of said motor rotors across a partition member.

* * * * *